(12) United States Patent
Smith et al.

(10) Patent No.: US 6,535,531 B1
(45) Date of Patent: Mar. 18, 2003

(54) GAS DISCHARGE LASER WITH PULSE MULTIPLIER

(75) Inventors: Scott T. Smith, San Diego, CA (US); Alexander I. Ershov, San Diego, CA (US); Rajasekhar M. Rao, San Diego, CA (US)

(73) Assignee: Cymer, Inc., San Diego, CA (US)

( * ) Notice: Subject to any disclaimer, the term of this patent is extended or adjusted under 35 U.S.C. 154(b) by 0 days.

(21) Appl. No.: 10/006,913

(22) Filed: Nov. 29, 2001

(51) Int. Cl.⁷ ................................................. H01S 3/10
(52) U.S. Cl. ......................................................... 372/25
(58) Field of Search ............................................. 372/25

(56) References Cited

U.S. PATENT DOCUMENTS

| | | | | |
|---|---|---|---|---|
| 4,945,220 A | * | 7/1990 | Mallory et al. | 250/201.3 |
| 4,948,212 A | * | 8/1990 | Cheng et al. | 359/7 |
| 5,489,984 A | * | 2/1996 | Hariharan et al. | 356/512 |
| 6,275,514 B1 | * | 8/2001 | Katzir et al. | 372/25 |
| 6,314,119 B1 | * | 11/2001 | Morton | 372/57 |

* cited by examiner

*Primary Examiner*—Paul Ip
*Assistant Examiner*—Dung Nguyen
(74) *Attorney, Agent, or Firm*—John R. Ross

(57) ABSTRACT

A gas discharge laser with a pulse multiplier. In the pulse multiplier, short pulses from the laser are divided into portions and all or all but one of these portions are delayed in delay legs by different time periods and recombined to provide a stretched output pulse having substantially reduced intensity and longer duration as compared to the pulse from the laser. Focusing optics are included in each delay leg to assure that beam size and angular spread of each portion of the combined pulse is not substantially different from other portions of the pulse.

9 Claims, 6 Drawing Sheets

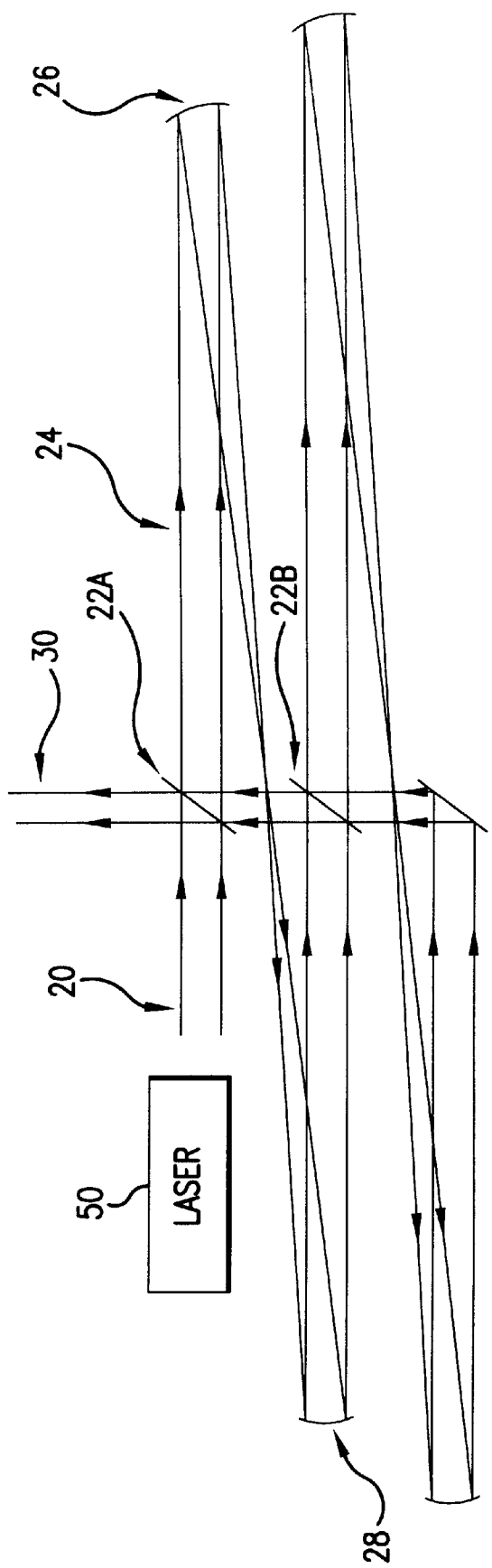

GAS DISCHARGE LASER WITH PULSE MULTIPLIER

This invention relates to gas discharge lasers and in particular short pulse gas discharge ultraviolet lasers such as KrF, ArF and $F_2$ lasers.

BACKGROUND OF THE INVENTION

Kryton fluoride gas discharge lasers producing 248 nm ultraviolet light are currently widely used as light sources in the integrated circuit lithography industry. The lasers typically operate in burst modes at duty factors of 20–40 percent around the clock 7 days per week. These lasers permit integrated circuit fabricators to produce integrated circuits with critical dimensions of about ¼ micron. In the future, the industry is expected to shift to light sources at smaller wavelengths in order to support even smaller critical dimensions. These sources for the most part are expected to be ArF lasers which produce a pulse beam at about 193 nm and $F_2$ lasers which produce a pulse beam at about 157 nm. These lasers typically operate at pulse repetition rates of about 1000 to 2500 pulses per second with pulse durations of about 20 to 50 ns.

Refractive optical components (including large lenses) of lithography machines used in integrated circuit fabrication are very expensive, costing several million dollars per machine. It is known that high intensity ultraviolet light causes deterioration of these refractive components and that the rate of deterioration increases with decreasing wavelength and also with the laser intensity. One form of optical damage known as two photon absorption is non-linear, increasing with the square of laser power intensity. In order to increase production of integrated circuit fabrication lines, there is a need to increase the power of the light sources.

The above issues were discussed in detail in U.S. Pat. No. 6,067,311 (hereby incorporated by reference) assigned to Applicant's employer. That patent discloses a pulse multiplier configurations for dividing each pulse from an excimer laser into multiple pulses such as four separate pulses each spaced apart in time by a time period approximately equal to the duration of the original pulse. This has the effect of stretching the pulse time-wise and reducing its instantaneous power without a substantial reduction in the energy of the pulse. One of the embodiments of that application is reproduced herein as prior art FIG. 1. In the FIG. 1 40 ns pulses of a ArF laser 50 are stretched to about 100 ns with a pulse multiplier unit. This is accomplished using two polarization beam splitters 58 and 62, six quarter wave plates and four maximum reflection mirrors. Legs of this system are 6 meters and 12 meters producing delays of 20 ns and 40 ns respectfully.

One problem with the system described in FIG. 1 as well as similar pulse stretchers is that laser beams from gas discharge lasers are usually slightly divergent and the amount of divergence changes over the life of the lasers. Therefore, if a pulse is separated into four parts with each of the parts following different path lengths before being recombined, the various portions of the pulses could have different beam size and angular spread. This is very undesirable.

What is needed is a better beam stretcher for gas discharge laser light sources.

SUMMARY OF THE INVENTION

The present invention provides a gas discharge laser with a pulse multiplier. In the pulse multiplier, short pulses from the laser are divided into portions and all or all but one of these portions are delayed in delay legs by different time periods and recombined to provide a stretched output pulse having substantially reduced intensity and longer duration as compared to the pulse from the laser. Focusing optics are included in each delay leg to assure that beam size and angular spread of each portion of the combined pulse is not substantially different from other portions of the pulse.

BRIEF DESCRIPTION OF THE DRAWINGS

FIGS. 3, 4, 6 and 8 are layouts of other preferred embodiments of the present invention.

DETAILED DESCRIPTION OF PREFERRED EMBODIMENTS

Preferred embodiment of the present invention can be described by reference to the figures.

First Preferred Embodiment

Figure 1:
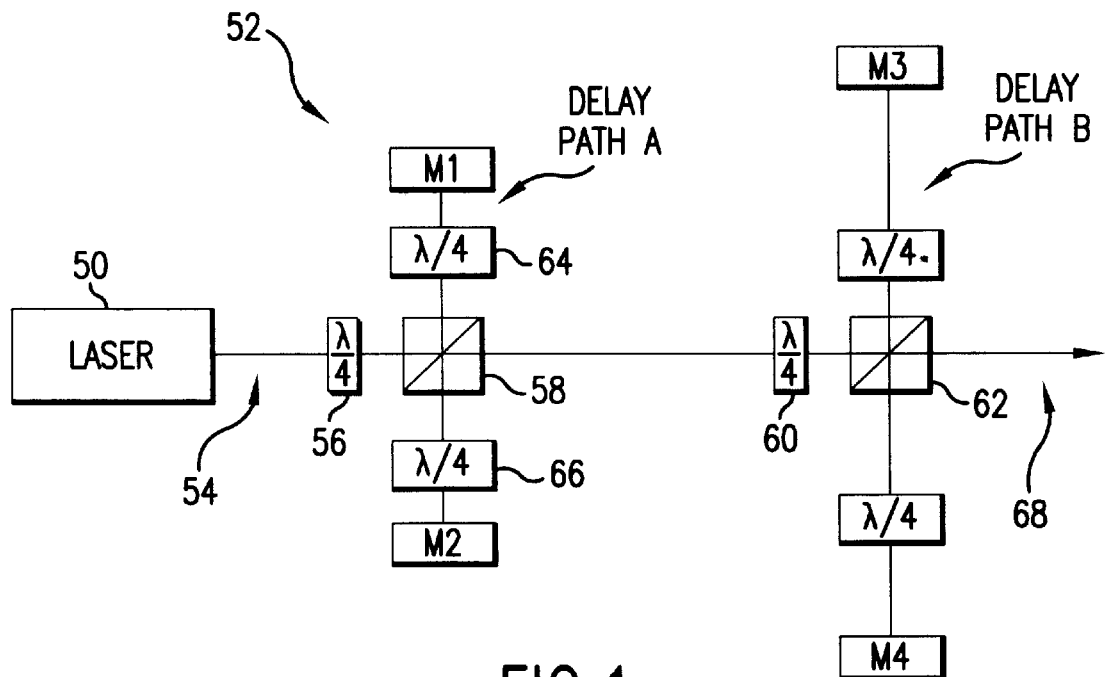
FIG. 1 is a prior art laser with a pulse multiplier.
Figure 2:
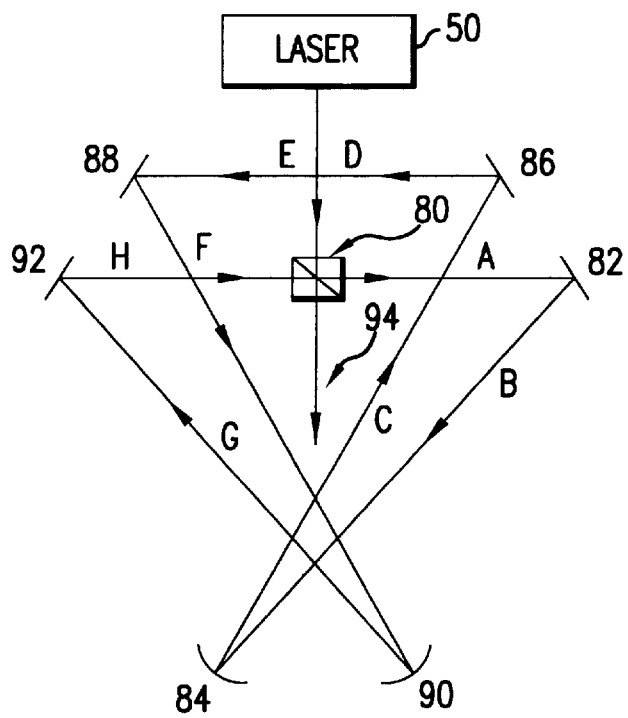
FIG. 2 is a layout of the preferred embodiment of the present invention.

A pulse multiplier for stretching the pulses of a gas discharge laser is shown in FIG. 2. This laser preferably a 4000 Hz ArF excimer laser designed for use as a lithography light source. Such lasers are described in detail in U.S. patent application Ser. No. 09/854,097 (incorporated by reference herein). In this case a 40 ns, 4000 pulses per second, 193 nm laser beam from the ArF laser 50 is directed at beam splitter 80 which reflects about 40 percent of the light and transmits 60 percent in direction 94. The 60 percent which is reflected (a delayed portion) is reflected again from maximum reflection mirror 82 to spherical mirror 84 to maximum reflection mirror 86 to maximum reflection mirror 88 to spherical mirror 90 to maximum reflection mirror 92 back to beam splitter 80 where about 40 percent of the light in the first delayed portion of the beam is reflected in direction 94 and about 60 percent transmits beam splitter along path A to make another loop around the A through H path as shown in FIG. 2. Again, about 40 percent of this second delayed portion of the beam is reflected by beam splitter 80 but this time in the direction 94 and 60 percent of the second delayed portion transmits beam splitter 80 and makes another trip around the A–H loop. This time, as before, 40 percent is reflected to become a part of the stretched beam heading out in direction 94 but at this point the portion added to the stretched beam amounts to only about 10 to 13 percent of the original beam.

This particular pulse stretcher is designed to assure that the divergence of each portion of the stretched beam is approximately the same. This is done by assuring that:

1) the lengths of path sections A plus B is approximately equal to the focal length of mirror 84, that the path lengths C plus D is approximately equal to the focal length of mirror 84.

2) the length of path section E plus F as well as G plus H are similarly approximately equal to the focal length of mirror 90 which is also approximately equal to the focal length of mirror 84.

3) the length of path sections C plus D plus E plus F is approximately equal to twice the focal length of mirrors 84 and 90.

With these restrictions, the original profile of the beam at beam splitter 80 is re-imaged on each return to beam splitter 80 of the delayed portions of the beam. Therefore, the beam size and angular spread of each delayed portion as it is added to the stretched beam will have virtually the same beam size and angular spread as the originally transmitted portion. Thus all portions of the stretched pulse will have virtually the same beam size and angular spread.

With the restrictions provided above, the entire delay path (paths A–H) is 4F (i.e., four times the focal lengths of mirrors 84 and 90. For an ArF with an original pulse length of about 25 ns, path lengths A–H should preferably be chosen so that the total path length (A–H) is about 25 feet (which will produce a delay of about 25 ns).

Second Preferred Embodiment

Figure 3:
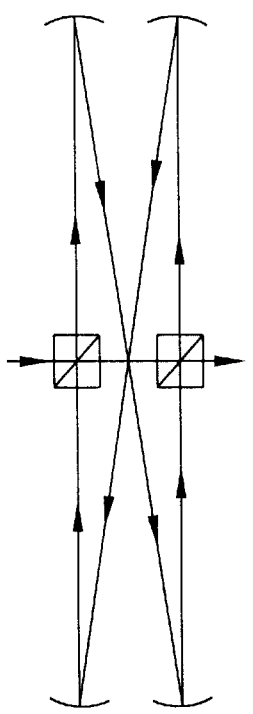

A second preferred embodiment is shown in FIG. 3. This design is similar to the one shown in FIG. 2; however, it only requires one beam splitter and four concave mirrors. The dimension of the legs are about 6 feet so it is very compact. One minor problem with this design is that for the focal points along the path to be at the beam cross points the hypotenuses shown in the figure would have to be the same lengths as the long leg of the triangles. This is not possible so there will have to be some defocusing. However, if the apex angles are kept small the extent of the defocusing will be very small and the defocusing should not be a significant problem.

Third Preferred Embodiment

Figure 4:
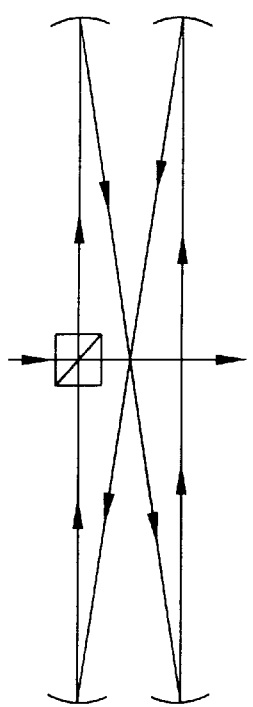

A third preferred embodiment is shown in FIG. 4. This design is a 4X design. It requires four concave mirrors and two beam splitters. With 6 foot major legs, the pulses will be separated by about 12 ns. This design has the added advantage that each pulse portion has its profile inverted so it will substantially reduce the coherence of the beam. (Reduced coherence is desirable for ultraviolet light sources used for lithography.)

Beam Splitter

All of the components of the embodiments shown in FIGS. 2, 3 and 4 are reflective except the beam splitters. These beam splitters, especially the first one such as at 80 in FIG. 2, will be subject to high energy, high intensity ultraviolet short duration laser pulses. Most beam splitters are designed with reflective coatings chosen to provide the desired separations. These coatings normally deteriorate in high intensity UV light. Therefore, if these types of beam splitters are used it may be desirable to design the unit for easy replacement of the beam splitter (or beam splitters). In this case, the beam splitter will be treated as a disposable part. However, it is preferable to use robust beam splitters which would need to be replaced only rarely.

Figure 5A:
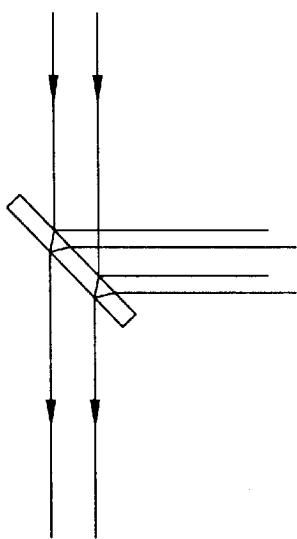
FIGS. 5A, 5B and 5C are sketches of beam splitters.
Figure 5B:
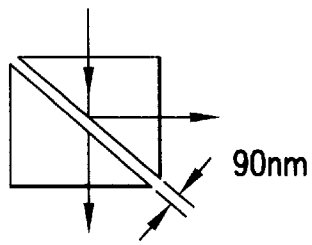
Figure 5C:
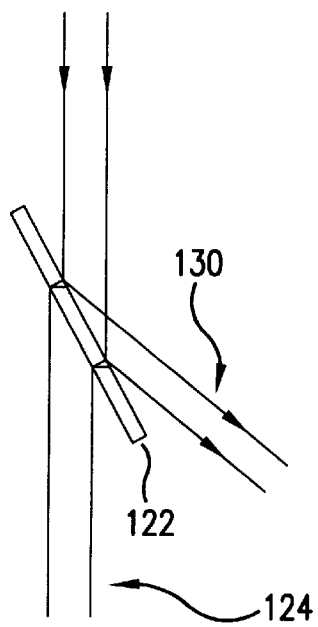

FIG. 5A shows a typical prior art beam splitter. Reflections occur at both surfaces. Sometimes anti-reflection coatings are applied to one side to reduce reflections from that side. FIG. 5C shows a technique in which a transparent plate is oriented at a large angle to increase the uncoated reflected portion of the beam. To achieve a 40 percent reflection, the plate is tilted to produce a Fresnel reflection from one side of 20%. For p-polarized 193 nm light and a CaF plate, this angle is about 78 degrees and for s-polarized light the angle is about 61 degrees. Beam splitters with no coatings last longer.

Frustrated Total Internal Reflection

One possible design of a robust beam splitter would utilize the optical property of frustrated total internal reflection. Frustrated total internal reflection is the optical equivalent of quantum mechanical tunneling. If an optical beam is incident upon a refractive boundary at an angle beyond the critical angle, part of the beam (known as an evanescent wave) will extend beyond the boundary. This evanescent wave exponentially decreases in amplitude to negligible levels for distances more than a couple of wavelengths beyond the boundary. However, if another optical material is placed close enough to the boundary (e.g., less than 200 nm) some of this evanescent wave will "jump" the gap and be transmitted through the gap to second optical element. The magnitude of the transmission and therefore the magnitude of the reflection can be controlled by the specific distance the two elements are separated. To obtain a 62% reflectivity at 193 nm in fused silica the two surfaces need to be separated by approximately 90 nm. FIG. 5B illustrates one possible beam splitter design based upon this optical principle.

There are at least two manufacturing approaches that could be used to manufacture such an optic. This first approach would be to make 90 nm spacers from a thin film. The thin film would be located out of the direct beam path and could be made out of a hard material that need not transmit DUV. Another approach would be to use ion beam etching. A pocket or well could be etched into one of the halves to produce the 90 nm air space. In such a design the initial surface flatness would be maintained outside the pocket.

Fourth Preferred Embodiment

Figure 6:
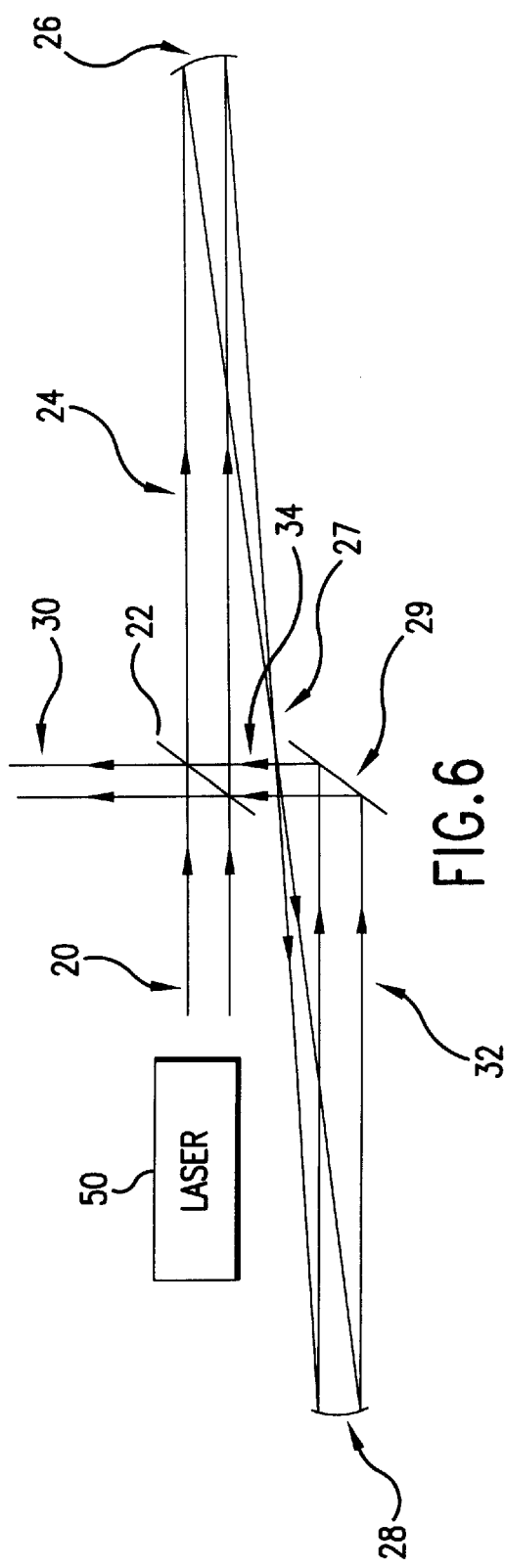
Figure 7A:
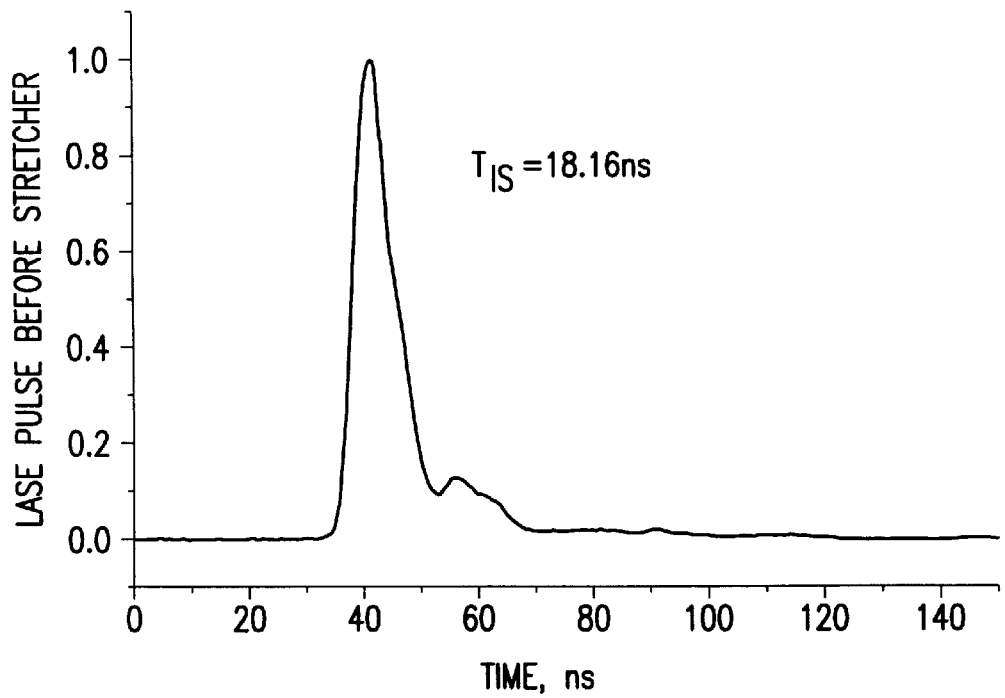
FIG. 7A shows the shape of a typical output beam of an ArF excimer laser.
Figure 7B:
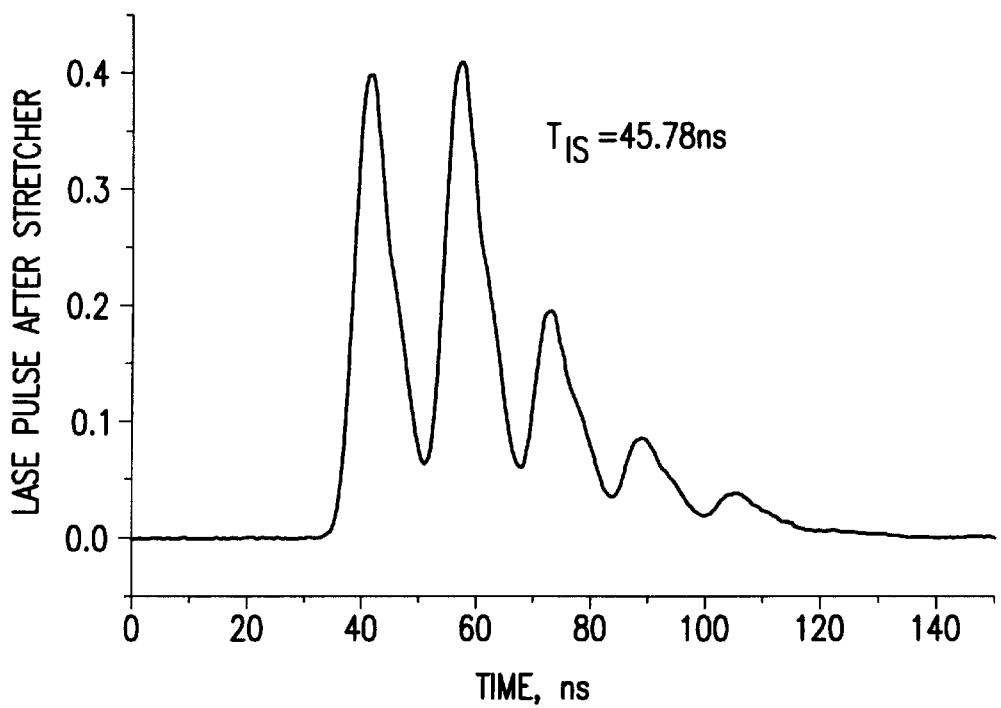
FIGS. 7B and 8A are simulated stretched pulses using preferred embodiments of the present invention.

A fourth preferred embodiment of the present invention is shown in FIG. 6. Light beam 20 from laser 50 hits the beam splitter 22. Beam splitter has a reflectivity of about 40%. About 40% of the light reflects a first portion of the output beam 30. The rest of the incoming beam transmits through the beam splitter 22 as beam 24. The beam is reflected back at a small angle by a mirror 26, which is a spherical mirror with the focal length equal the distance from beam splitter 22 to the mirror. So, the beam is focused to a point 27 near the beam splitter 22 but missing it slightly. This beam spreads again and is now reflected by mirror 28, which is also a spherical mirror with the focal length equal the distance from this mirror to point 27. The mirror 28 reflect the beam back at a small angle and also collimates the reflected beam. This reflected beam 32 propagates to the right and is reflected by mirror 29 to beam splitter 22 where about 60% of the beam is transmitted through beam splitter 22 to merge into and become the second portion of output beam 30. A portion (about 40%) of beam 34 is reflected by the beam splitter 22 in the direction of beam 24 for a repeat of the trip of beam 32. As a result, a short input pulse is split into several portions, so that total duration of the beam is increased and its peak intensity is decreased. Mirrors 26 and 28 create a relay system which images the portions of the outcoming beam onto each other. Because of that imaging, each portion of the output beam is virtually the same. (If mirrors 26 and 28 were flat, beam divergence would spread the beam for each subsequent repetition, so beam size would be different for each repetition.) The total optical path length from beam splitter 22 to mirror 26 to mirror 28 to mirror 27 and, finally, to beam splitter 22 determines the time delay between repetitions. FIG. 7A shows the pulse profile of a typical pulse produced by an ArF excimer laser. FIG. 7B shows the simulated output pulse profile of a similar ArF laser pulse after being spread in a pulse stretcher built in accordance with FIG. 6. In this example the $T_{is}$ of the pulse was increased from 18.16 ns to 45.78 ns. ($T_{is}$ is a measure of pulse duration used for describing laser pulses. It refers to the integral square pulse duration.)

Figure 8A:
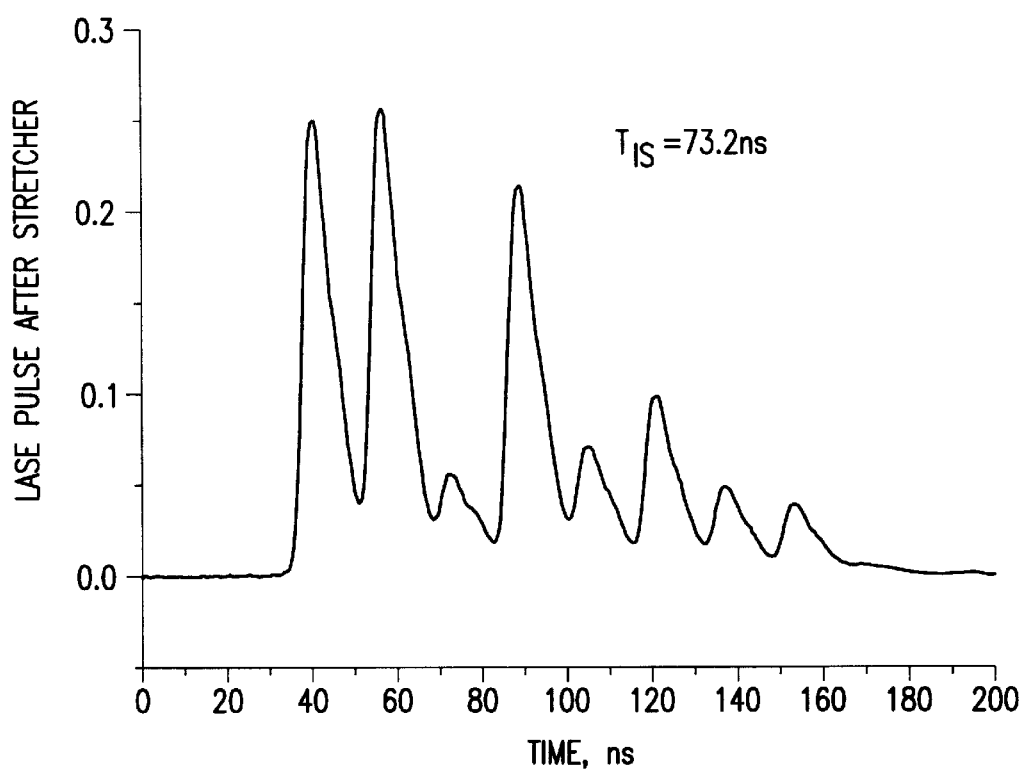

FIG. 8 shows a layout similar to the FIG. 6 layout but with an additional delay path. In this case, the first beam splitter 22A is designed for a reflection of 25 percent and the second beam splitter 22B is designed for a reflection of 40 percent. The resulting beam shape produced by computer simulation is shown in FIG. 8A. The $T_{is}$ for this stretched pulse is about 73.2 ns.

While particular embodiments of the present invention have been shown and described, it will be obvious to those skilled in the art that changes and modifications may be made without departing from this invention in its broader aspects. For example, the pulse multiplier can be made more compact using additional mirrors. Additional delay legs can be added. Various known provisions could be added to the optical elements to simplify alignment and to keep the optics in alignment. This could include active alignment with feedback controls. The spherical mirrors in the examples could be replaced by other focusing mirrors such as cylindrical mirrors or parabolic mirrors. Therefore, the scope of the invention should be determined by the claims and their legal equivalents and not by the specific examples that have been given.

We claim:

1. A gas discharge laser system with pulse multiplication comprising:
   A) a gas discharge laser configured to produce a laser output pulse beam at a pulse repetition rate of at least 2000 laser output pulses per second, each pulse defining intensity values:
   B) a pulse multiplier optical system arranged to receive said output pulse laser beam and to multiply the number of pulses per second by at least a factor of two so as to produce a single multiplier output pulse beam comprised of a larger number of pulses with substantially reduced intensity values as compared with the laser output pulses, and pulse multiplier optical system comprising:
      (1) a first beam splitter arranged to separate a portion of said output beam, the separated portion defining a delayed portion, and the output beam defining a beam size and angular spread at said first beam splitter;
      (2) a first delay path originating and terminating at said first beam splitter said first delay path comprising at least two focusing mirrors, said mirrors being arranged to focus said delayed portion at a focal point within said first delay path and to return said delayed portion to said first beam splitter with a beam size and angular spread equal to or approximately equal to the beam size and angular spread of the output beam at said first beam splitter.

2. A laser system as in claim 1 wherein said at least two focusing mirrors are spherical mirrors.

3. A laser system as in claim 1 and further comprising a second delay path comprising at least two spherical mirrors.

4. A laser system as in claim 1 wherein said first delay path comprises four focusing mirrors.

5. A laser system as in claim 4 and further comprising said second delay path created by a second beam splitter located in said first delay path.

6. A laser as in claim 1 wherein said first delay path comprises a second beam splitter and further comprising a second delay path comprising at least two focusing mirrors, said mirrors being arranged to focus said delayed portion at a focal point within said first delay path and to return said delayed portion to said first beam splitter with a beam size and angular spread equal to or approximately equal to the beam size and angular spread of the output beam at said first beam splitter.

7. A laser as in claim 1 wherein said first beam splitter is configured to direct a laser beam in at least two directions utilizing optical property of frustrated internal reflection.

8. A laser as in claim 1 wherein said first beam splitter is comprised of two transparent optical elements each element having a flat surface, said optical elements being positioned with said surfaces parallel to each other and separated by less than 200 nm.

9. A laser as in claim 1 wherein said first beam splitter is an uncoated optical element oriented at an angle with said output laser beam so as to achieve a desired reflection-transmission ratio.

* * * * *